(12) United States Patent
Geiszler

(10) Patent No.: US 9,876,387 B2
(45) Date of Patent: Jan. 23, 2018

(54) WIRELESS BATTERY CHARGING SYSTEMS AND METHODS FOR AN ELECTRONIC LOCK

(71) Applicant: FP Wireless LLC, San Jose, CA (US)

(72) Inventor: Theodore D. Geiszler, Monte Sereno, CA (US)

(73) Assignee: FP Wireless LLC, San Jose, CA (US)

(*) Notice: Subject to any disclaimer, the term of this patent is extended or adjusted under 35 U.S.C. 154(b) by 0 days.

(21) Appl. No.: 15/639,861

(22) Filed: Jun. 30, 2017

(65) Prior Publication Data

US 2017/0331320 A1 Nov. 16, 2017

Related U.S. Application Data

(63) Continuation of application No. 14/699,867, filed on Apr. 29, 2015, now abandoned.

(51) Int. Cl.
| | |
|---|---|
| *H01M 10/44* | (2006.01) |
| *H01M 10/46* | (2006.01) |
| *H02J 7/02* | (2016.01) |
| *H02J 7/00* | (2006.01) |
| *G07C 9/00* | (2006.01) |

(Continued)

(52) U.S. Cl.
CPC .......... *H02J 7/025* (2013.01); *G07C 9/00309* (2013.01); *H02J 7/0042* (2013.01); *H04Q 9/00* (2013.01); *G01R 31/3689* (2013.01); *G07C 2009/00634* (2013.01);
(Continued)

(58) Field of Classification Search
CPC .......... H02J 7/025; H02J 7/0042; H02J 7/355; H02J 5/005
USPC ........ 320/108, 114, 115, 132, 149; 307/104; 292/1; 70/277, 271, 431
See application file for complete search history.

(56) References Cited

U.S. PATENT DOCUMENTS

| | | |
|---|---|---|
| 3,938,018 A | 2/1976 | Dahl |
| 5,733,313 A | 3/1998 | Barreras, Sr. et al. |

(Continued)

FOREIGN PATENT DOCUMENTS

| | | |
|---|---|---|
| AU | 1998052770 | 7/1998 |
| CN | 2797546 Y | 7/2006 |

(Continued)

OTHER PUBLICATIONS

Assa Abloy ICPT Product Materials, Assa Abloy, Nov. 2012.
C. Sharpe, Wireless Power Transfer for Access Control Applications, Access & Security, Jul. 17, 2017.

*Primary Examiner* — Edward Tso
(74) *Attorney, Agent, or Firm* — CanaanLaw, P.C.; David B. Ritchie

(57) ABSTRACT

Example systems and methods are described that wirelessly charge a rechargeable battery associated with a lock. In one implementation, a rechargeable battery is electrically coupled to an electronic lock module associated with a door corresponding to a door frame. An electronic control module associated with the door frame and physically separate from the electronic lock module generates a wireless charging link between the electronic control module and the electronic lock module. The electronic control module transmits a charging signal to the electronic lock module via the wireless charging link, and the electronic lock module uses this charging signal to charge the rechargeable battery. The implementation also includes a lock associated with the door that can be locked or unlocked by the electronic lock module.

9 Claims, 10 Drawing Sheets

(51) Int. Cl.
*H04Q 9/00* (2006.01)
*G01R 31/36* (2006.01)
*H02J 50/20* (2016.01)

(52) U.S. Cl.
CPC .... *G07C 2009/00642* (2013.01); *H02J 50/20* (2016.02); *H04Q 2209/40* (2013.01); *H04Q 2209/823* (2013.01)

(56) References Cited

U.S. PATENT DOCUMENTS

| | | |
|---|---|---|
| 7,113,070 B2 | 9/2006 | Deng et al. |
| 8,294,302 B2 | 10/2012 | Peabody et al. |
| 8,354,914 B2 | 1/2013 | Buckingham et al. |
| 8,551,163 B2 | 10/2013 | Aber et al. |
| 8,638,062 B2 | 1/2014 | Baarman et al. |
| 8,686,598 B2 | 4/2014 | Schatz et al. |
| 8,772,970 B2 | 7/2014 | Lambrou |
| 8,774,714 B2 | 7/2014 | Metivier |
| 8,805,530 B2 | 8/2014 | John |
| 8,825,173 B2 | 9/2014 | Forsell |
| 8,862,241 B2 | 10/2014 | Forsell |
| 8,901,775 B2 | 12/2014 | Armstrong et al. |
| 8,907,531 B2 | 12/2014 | Hall et al. |
| 9,089,717 B2 | 7/2015 | Forsell |
| 9,132,276 B2 | 9/2015 | Meskens |
| 9,290,966 B2 | 3/2016 | Hanchett, Jr. |
| 2004/0183652 A1 | 9/2004 | Deng et al. |
| 2007/0146115 A1 | 6/2007 | Roosli et al. |
| 2008/0300658 A1 | 12/2008 | Meskens |
| 2010/0179384 A1 | 7/2010 | Hoeg et al. |
| 2011/0195666 A1 | 8/2011 | Forsell |
| 2011/0227529 A1 | 9/2011 | Smith et al. |
| 2011/0311084 A1 | 12/2011 | Drader |
| 2012/0235502 A1 | 9/2012 | Kesler et al. |
| 2013/0214731 A1 | 8/2013 | Dinsmoor |
| 2013/0293025 A1 | 11/2013 | Xu et al. |
| 2013/0307474 A1 | 11/2013 | Shimura et al. |
| 2014/0136414 A1 | 5/2014 | Abhyanker |
| 2014/0197692 A1 | 7/2014 | Chen et al. |
| 2014/0241555 A1 | 8/2014 | Terlizzi |
| 2014/0260459 A1 | 9/2014 | Nguyen et al. |
| 2014/0340032 A1 | 11/2014 | Curtis |
| 2015/0008761 A1 | 1/2015 | Kesler et al. |
| 2015/0048790 A1 | 2/2015 | Rudser et al. |
| 2016/0322847 A1 | 11/2016 | Geiszler |
| 2016/0322855 A1 | 11/2016 | Geiszler |
| 2017/0018956 A1 | 1/2017 | Geiszler |

FOREIGN PATENT DOCUMENTS

| | | |
|---|---|---|
| CN | 102071838 B | 10/2012 |
| CN | 204103574 U | 1/2015 |
| DE | 3612761 A1 | 10/1987 |
| DE | 10206700 A1 | 8/2003 |
| EP | 2660785 A2 | 11/2013 |
| WO | 2000077330 A1 | 12/2000 |
| WO | 2002077399 A1 | 10/2002 |
| WO | 2005041385 A2 | 5/2005 |
| WO | 2006006834 A1 | 1/2006 |
| WO | 2008011657 A1 | 1/2008 |
| WO | 2016175910 A1 | 11/2016 |

WIRELESS BATTERY CHARGING SYSTEMS AND METHODS FOR AN ELECTRONIC LOCK

RELATED APPLICATIONS

This application is a continuation of, and claims priority to Ser. No. 14/699,867, filed on Apr. 29, 2015, which is incorporated herein by reference in its entirety.

TECHNICAL FIELD

The present disclosure relates to systems and methods used to wirelessly recharge a battery, such as a battery that powers a door lock.

BACKGROUND

In the field of wireless electronic systems powered by rechargeable batteries, there exists a need for a system that can recharge a rechargeable battery wirelessly, especially in the field of wireless electronic door locking systems. Typical electronic door locks are powered by battery packs that are bulky and disposable (i.e., not rechargeable). These battery packs typically need to be replaced periodically. Regular maintenance on these electronic door locks is therefore required to replace the disposable batteries.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

Figure 1:
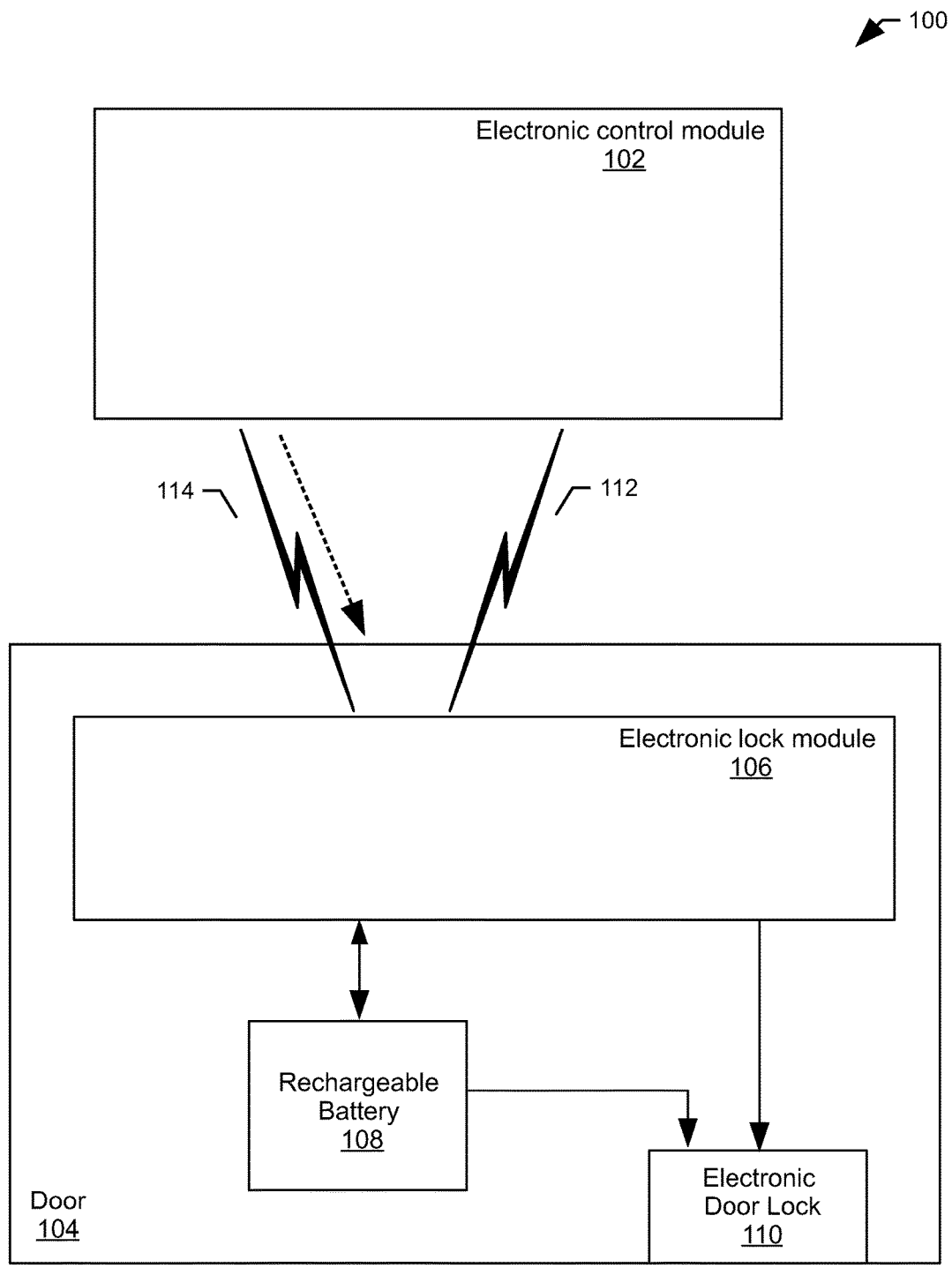
FIG. 1 represents a block diagram that shows an embodiment of the wireless battery charging system.

In the following description, reference is made to the accompanying drawings that form a part thereof, and in which is shown by way of illustration specific exemplary embodiments in which the disclosure may be practiced. These embodiments are described in sufficient detail to enable those skilled in the art to practice the concepts disclosed herein, and it is to be understood that modifications to the various disclosed embodiments may be made, and other embodiments may be utilized, without departing from the scope of the present disclosure. The following detailed description is, therefore, not to be taken in a limiting sense.

Reference throughout this specification to "one embodiment," "an embodiment," "one example," or "an example" means that a particular feature, structure, or characteristic described in connection with the embodiment or example is included in at least one embodiment of the present disclosure. Thus, appearances of the phrases "in one embodiment," "in an embodiment," "one example," or "an example" in various places throughout this specification are not necessarily all referring to the same embodiment or example. Furthermore, the particular features, structures, databases, or characteristics may be combined in any suitable combinations and/or sub-combinations in one or more embodiments or examples. In addition, it should be appreciated that the figures provided herewith are for explanation purposes to persons ordinarily skilled in the art and that the drawings are not necessarily drawn to scale.

Embodiments in accordance with the present disclosure may be embodied as an apparatus, method, or computer program product. Accordingly, the present disclosure may take the form of an entirely hardware-comprised embodiment, an entirely software-comprised embodiment (including firmware, resident software, micro-code, etc.), or an embodiment combining software and hardware aspects that may all generally be referred to herein as a "circuit," "module," or "system." Furthermore, embodiments of the present disclosure may take the form of a computer program product embodied in any tangible medium of expression having computer-usable program code embodied in the medium.

Any combination of one or more computer-usable or computer-readable media may be utilized. For example, a computer-readable medium may include one or more of a portable computer diskette, a hard disk, a random access memory (RAM) device, a read-only memory (ROM) device, an erasable programmable read-only memory (EPROM or Flash memory) device, a portable compact disc read-only memory (CDROM), an optical storage device, and a magnetic storage device. Computer program code for carrying out operations of the present disclosure may be written in any combination of one or more programming languages. Such code may be compiled from source code to computer-readable assembly language or machine code suitable for the device or computer on which the code will be executed.

Embodiments may also be implemented in cloud computing environments. In this description and the following claims, "cloud computing" may be defined as a model for enabling ubiquitous, convenient, on-demand network access to a shared pool of configurable computing resources (e.g., networks, servers, storage, applications, and services) that can be rapidly provisioned via virtualization and released with minimal management effort or service provider interaction and then scaled accordingly. A cloud model can be composed of various characteristics (e.g., on-demand self-service, broad network access, resource pooling, rapid elasticity, and measured service), service models (e.g., Software as a Service ("SaaS"), Platform as a Service ("PaaS"), and Infrastructure as a Service ("IaaS")), and deployment models (e.g., private cloud, community cloud, public cloud, and hybrid cloud).

The flow diagrams and block diagrams in the attached figures illustrate the architecture, functionality, and operation of possible implementations of systems, methods, and computer program products according to various embodiments of the present disclosure. In this regard, each block in the flow diagrams or block diagrams may represent a module, segment, or portion of code, which includes one or more executable instructions for implementing the specified logical function(s). It will also be noted that each block of the block diagrams and/or flow diagrams, and combinations of blocks in the block diagrams and/or flow diagrams, may be implemented by special purpose hardware-based systems that perform the specified functions or acts, or combinations of special purpose hardware and computer instructions. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flow diagram and/or block diagram block or blocks.

The systems and methods described herein disclose an apparatus and methods that are configured to wirelessly recharge a rechargeable battery that is associated with, and powers, an electronic door locking system. The system consists of an electronic lock module attached to a door. The electronic lock module is electrically coupled to a rechargeable battery, which powers both the electronic lock module and an electronic door lock associated with the door. In an embodiment, an electronic control module is physically coupled (attached) to a door frame corresponding to the door. The electronic control module receives periodic input data from the electronic lock module, wherein the input data includes the status of the charge on the rechargeable battery. The electronic control module processes the data received from the electronic lock module and determines whether the charge on the rechargeable battery has fallen below a threshold value, wherein the threshold value is either a predetermined threshold value, or the threshold value is dynamically computed based on a plurality of variables that include but are not limited to the age of the battery, the temperature of the battery, the ambient temperature and the use rate. If the electronic control module determines that the charge on the rechargeable battery has fallen below the threshold value, the electronic control module wirelessly transmits a charging signal to the electronic lock module. The electronic lock module wirelessly receives this charging signal and uses this charging signal to charge the rechargeable battery, thereby eliminating the need for periodic inspection or maintenance of the door lock in order to replace or otherwise service the batteries in a disposable battery pack.

FIG. 1 represents a block diagram that shows an embodiment of a wireless battery charging system 100. In this embodiment, the system is comprised of an electronic lock module 106 attached to a door 104. An electronic control module 102 is located in proximity to the electronic lock module 106, but is physically separate from the electronic lock module 106 and physically separate from the door 104. In some embodiments, the electronic control module 102 is attached to the door frame corresponding to the door 104. In other embodiments, the electronic control module 102 can be attached to a wall adjacent to the door frame corresponding to the door 104. The electronic control module 102 can be located anywhere, as long as the electronic control module 102 and the electronic lock module 106 are able to establish a bidirectional data communications link 112 and a wireless charging link 114. The bidirectional data communications link 112 allows bidirectional exchange of data between the electronic control module 102 and the electronic lock module 106. The data transmitted over the bidirectional data communications link 112 includes, but is not limited to, the status of the charge on a rechargeable battery 108 as transmitted over the bidirectional data communications link 112 by the electronic lock module 106 to the electronic control module 102. In some embodiments, the data transmitted over the bidirectional data communications link 112 is encrypted by using an encryption method such as the Advanced Encryption Standard (AES). Other encryption methods may also be used to encrypt the data transmitted over the bidirectional data communications link 112. In other embodiments, the wireless charging link 114 is a unidirectional wireless link that wirelessly transmits a charging signal used to recharge rechargeable battery 108. The wireless charging link 114 wirelessly transmits the charging signal from the electronic control module 102 to the electronic lock module 106. Example methods used to implement the bidirectional data communications link 112 and the wireless charging link 114 include radio frequency (RF), inductive coupling, magnetic coupling and infrared (IR) or any combination of these. Examples of RF wireless communication links include Bluetooth, Bluetooth Low Energy, ZigBee or any other wireless bidirectional RF data communications link. Examples of inductive coupling links include wire-wound solenoids and air-wound coils. Examples of IR wireless communication links include optical communication links implemented by using infrared diodes and infrared laser diodes. In some embodiments, the wireless charging link 114 is also used to communicate unidirectional data as well, from the electronic control module 102 to the electronic lock module 106, in which case the bidirectional data communications link 112 now transmits unidirectional data, from the electronic lock module 106 to the electronic control module 102. The rechargeable battery 108 is attached to the door 104 and is used to power an electronic door lock 110. In some embodiments, the rechargeable battery 108 is used to power the electronic lock module 106, while the electronic control module 102 is powered by a source independent of the rechargeable battery 108.

During operation of an embodiment of system 100, the electronic lock module 106 periodically monitors the charge status on the rechargeable battery 108. The electronic lock module 106 periodically transmits the charge status on the rechargeable battery 108 to the electronic control module 102 via the bidirectional data communications link 112. The electronic control module 102 receives the periodic updates on the charge status on the rechargeable battery 108 from the electronic lock module 106 via the bidirectional data communications link 112. The electronic control module 102 identifies the charge status on the rechargeable battery 108 and compares the value of the charge on the rechargeable battery 108 to a threshold value. In one embodiment, the threshold value is 85% of the charge on the fully-charged battery. If the value of the charge on the rechargeable battery 108 has dropped below the threshold value, the electronic control module 102 determines that the battery needs to be recharged. If the battery needs to be charged, the electronic control module 102 wirelessly transmits a charging signal to the electronic lock module 106 via the wireless charging link 114. This embodiment thus implements a non-continuous charging method, wherein the charging signal is not transmitted wirelessly all the time, but is transmitted non-continuously based on the charge status of the rechargeable battery 108.

During the operation of another embodiment of system 100, the electronic control module 102 continuously transmits wirelessly a charging signal to the electronic lock module 106 via the wireless charging link 114, regardless of the status of the charge on the rechargeable battery 108. This embodiment thus implements a continuous charging method, wherein the charging signal is transmitted wirelessly all the time.

Figure 2A:
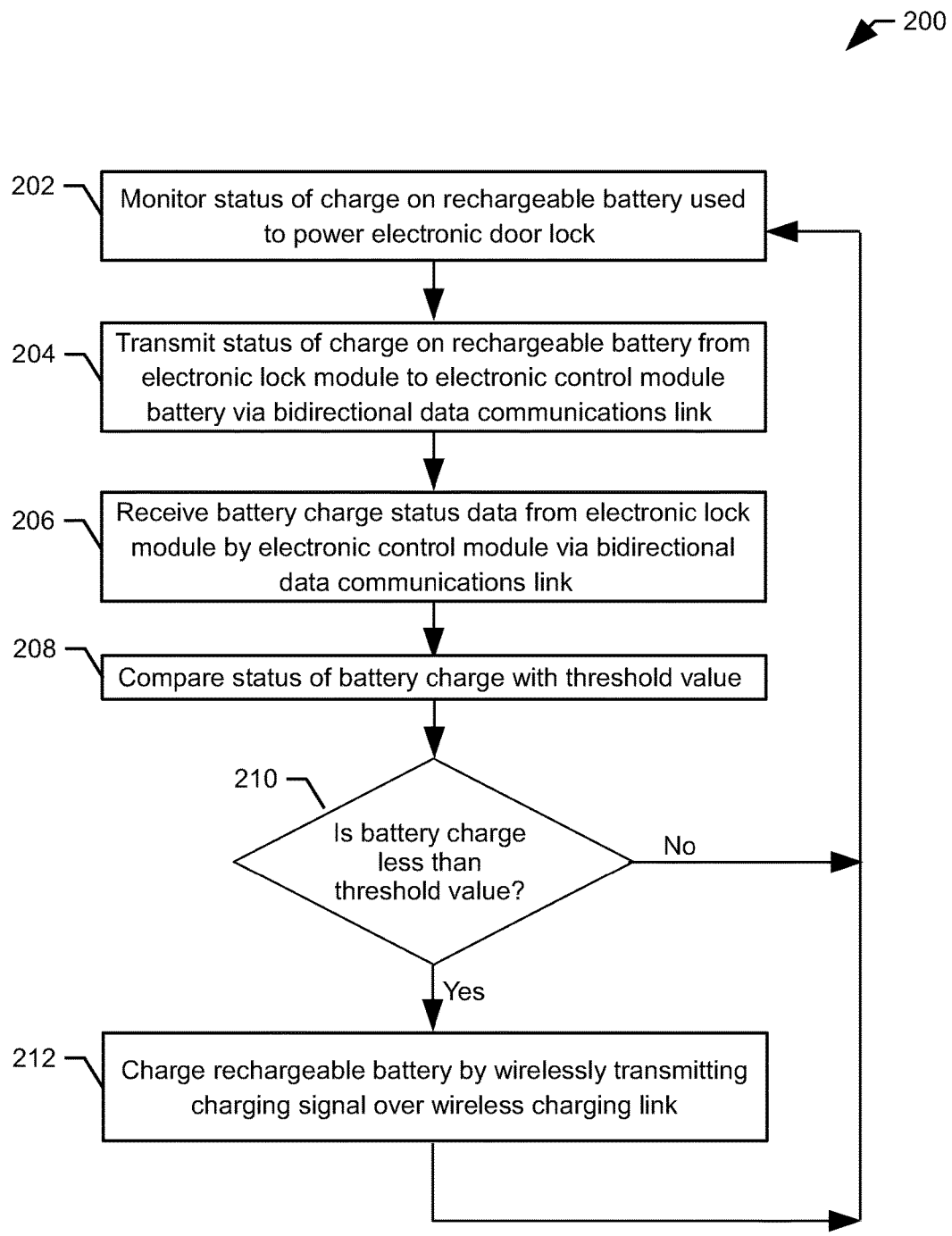
FIG. 2a represents a flow diagram depicting an embodiment of a method for monitoring the status of a rechargeable battery and wirelessly recharging the rechargeable battery if necessary via the wireless charging link.

FIG. 2a represents a flow diagram depicting an embodiment of a method 200 for monitoring the status of rechargeable battery 108 and wirelessly recharging the rechargeable battery if necessary via the wireless charging link 114. The method 200 is a non-continuous charging method. At 202, the method 200 monitors the status of the charge on the rechargeable battery 108 used to power the electronic door lock 110. The status of the charge on the rechargeable battery 108 is monitored by the electronic lock module 106. Next, at 204, the electronic lock module 106 transmits the status of the charge on the rechargeable battery 108 via the bidirectional data communications link 112 to the electronic control module 102. At 206, the electronic control module 102 receives the status of the charge on the rechargeable battery 108 transmitted by the electronic lock module 106 via the bidirectional data communications link 112.

At 208, the electronic control module compares the status of the charge on the rechargeable battery 108 to a threshold value. If the charge on the rechargeable battery 108 is greater than or equal to the threshold value (as determined at 210), the method 200 returns back to 202 since no recharging is required for the rechargeable battery 108. If the charge on the rechargeable battery 108 is less than the threshold value, the method 200 charges the rechargeable battery at 212 by wirelessly transmitting a charging signal over the wireless charging link 114, after which the method 200 returns to initial step 202.

Figure 2B:
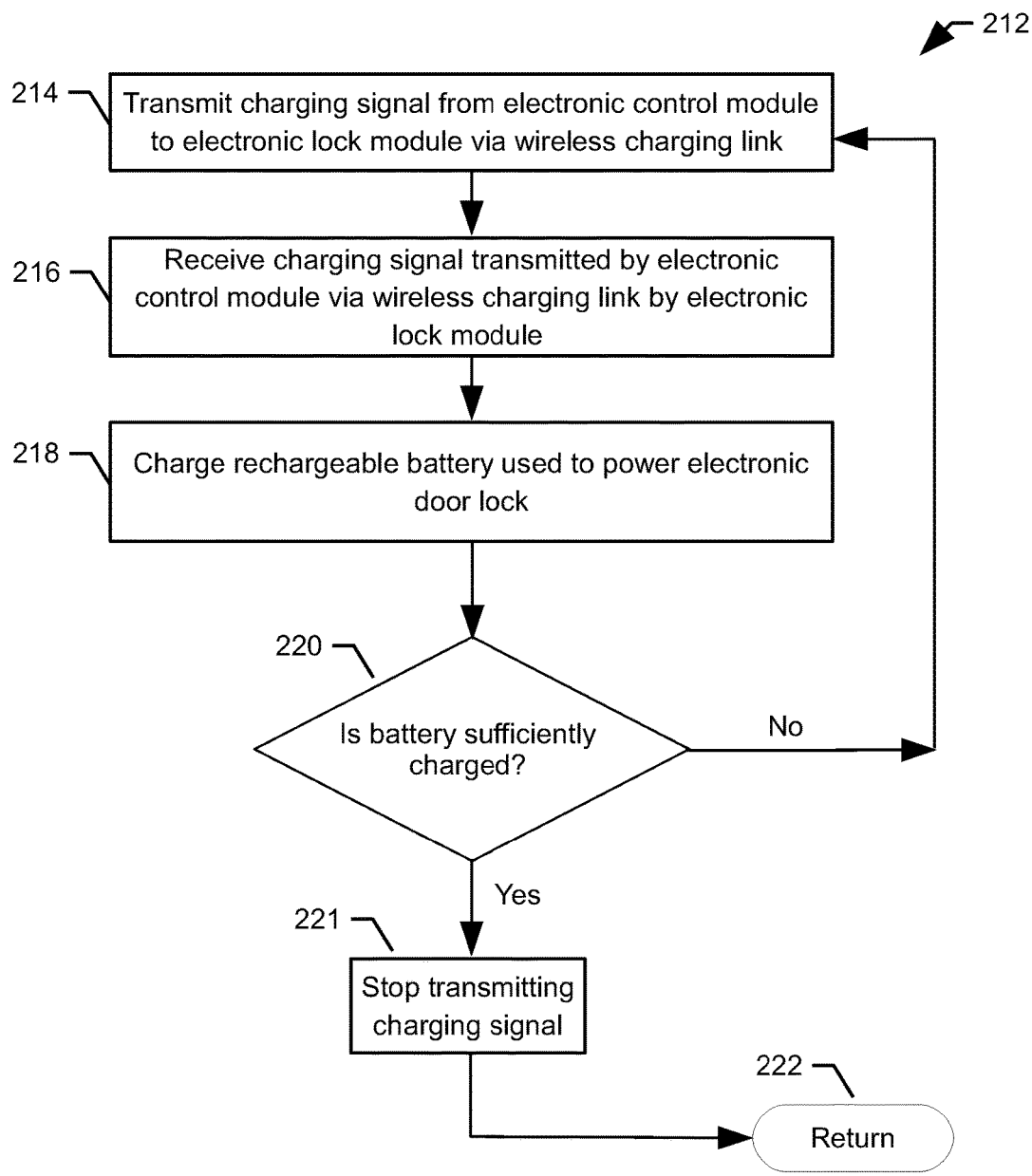
FIG. 2b represents a flow diagram depicting an embodiment showing the details of a method for wirelessly charging the rechargeable battery via the wireless charging link.

FIG. 2b represents a flow diagram depicting an embodiment showing the details of charging the rechargeable battery (shown as 212 in FIG. 2a) 108 via the wireless charging link 114. At 214, the electronic control module 102 wirelessly transmits a charging signal to the electronic lock module 106 via the wireless charging link 114. At 216, the electronic lock module 106 wirelessly receives the charging signal transmitted by the electronic control module 102 via the wireless charging link 114. At 218, the electronic lock module 106 charges the rechargeable battery 108 used to power the electronic door lock 110, where the electronic control module 102 continuously transmits the charging signal to the electronic lock module 106 via the wireless charging link 114. At 220, the method 212 checks if the rechargeable battery 108 is sufficiently charged, wherein the term "sufficiently charged" is used to denote that the rechargeable battery 108 is charged to a value that is around 100% capacity, where this value can be less than 100% capacity. Sufficiently charging the rechargeable battery 108 can include, for example, charging the rechargeable battery 108 up to 95% capacity, and includes cases where, for example, the rechargeable battery 108 is not able to charge up to a 100% charge capacity due to aging. If the rechargeable battery 108 is not sufficiently charged, then the method 212 returns back to 214. If the rechargeable battery 108 is sufficiently charged, then the method 212 stops transmitting the charging signal at 221 and continues to 222, where it returns to 202.

Figure 2C:
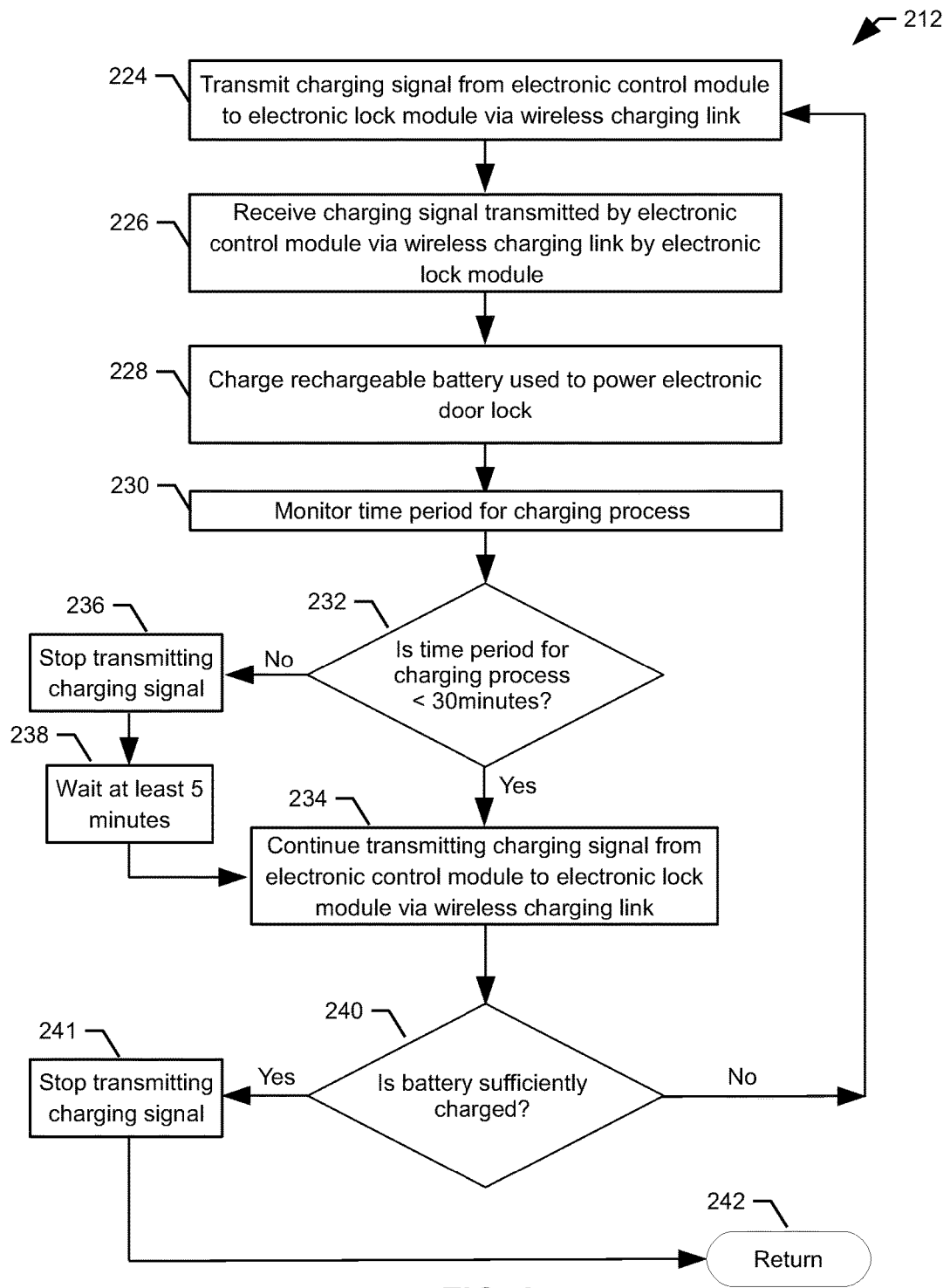
FIG. 2c represents a flow diagram depicting an alternate embodiment showing the details of a method for wirelessly charging the rechargeable battery via the wireless charging link.

FIG. 2c represents a flow diagram depicting an alternate embodiment showing the details of charging the rechargeable battery (shown as 212 in FIG. 2a) 108 via the wireless charging link 114. At 224, the electronic control module 102 wirelessly transmits a charging signal to the electronic lock module 106 via the wireless charging link 114. At 226, the electronic lock module 106 wirelessly receives the charging signal transmitted by the electronic control module 102 via the wireless charging link 114. At 228, the electronic lock module 106 charges the rechargeable battery 108 used to power the electronic door lock 110. At 230, the method monitors the time period for the charging process. At 232, the method 212 also checks if the time period for the charging process is less than 30 minutes. Alternate embodiments may use time periods shorter or longer than 30 minutes. If the time period for the charging process is less than 30 minutes, then the method 212 proceeds to 234; if the time period for the charging process is greater than 30 minutes, then the method stops transmitting the charging signal at 236 and waits for at least 5 minutes, at 238, before proceeding to 234 where the electronic control module 102 continues transmitting the charging signal to the electronic lock module 106 via the wireless charging link 114. At the next step 240, the method 212 checks if the rechargeable battery 108 is sufficiently charged, where the term "sufficiently charged" is used to denote that the rechargeable battery 108 is charged to a value that is around 100% capacity, and this value can be less than 100% capacity. Sufficiently charging the rechargeable battery 108 can include, for example, charging the rechargeable battery 108 up to 95% capacity, and includes cases where, for example, the rechargeable battery 108 is not able to charge up to a 100% charge capacity due to aging. If the rechargeable battery 108 is not sufficiently charged, then the method returns back to 224. If the rechargeable battery 108 is sufficiently charged, then the method stops transmitting the charging signal at 241 and goes to 242, where it returns to 202.

Figure 3:
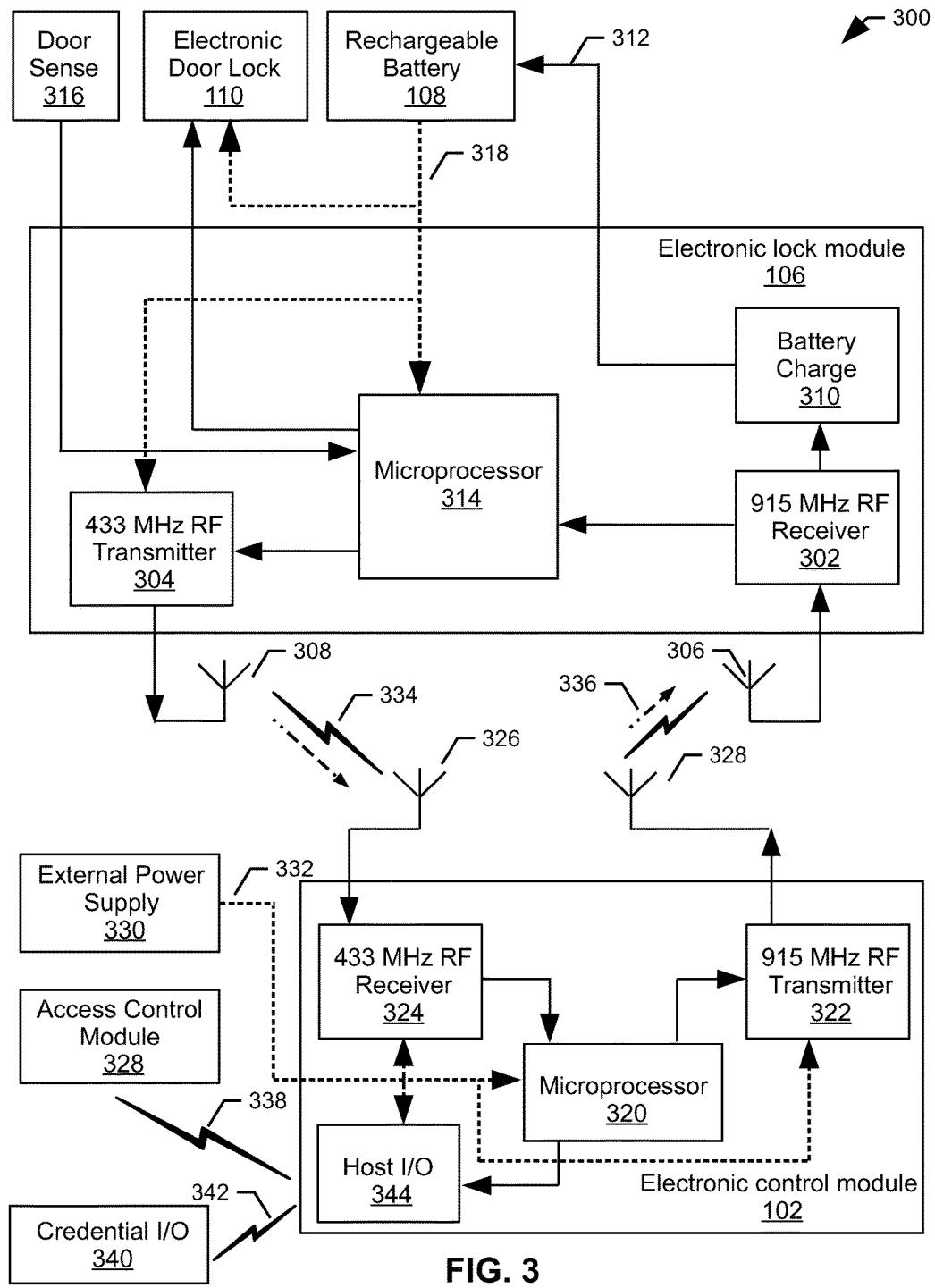
FIG. 3 represents a block diagram that shows one embodiment of the wireless battery charging system.

FIG. 3 represents a block diagram that shows one embodiment of a wireless battery charging system 300. This embodiment shows the electronic control module 102 and the electronic lock module 106 discussed above. Also shown are the rechargeable battery 108 and the electronic door lock 110. In one embodiment, the electronic lock module 106 includes a microprocessor 314, a 433 MHz RF transmitter 304, a 915 MHz RF receiver 302, and a battery charge module 310. In one embodiment, the rechargeable battery 108 supplies power to the electronic door lock 110, the microprocessor 314, and the 433 MHz transmitter 304, via the electronic lock module power supply bus 318. The 433 MHz RF transmitter 304 receives a signal from microprocessor 314, and outputs an RF signal at a frequency of 433 MHz. This RF signal is output to an RF antenna 308 for transmission through a unidirectional RF data communications link 334. The 915 MHz RF receiver 302 is powered by the wireless RF signal received by an RF antenna 306 over a unidirectional RF data communications link 336.

In one embodiment, the electronic control module 102 includes a microprocessor 320, a 915 MHz RF transmitter 322, a 433 MHz RF receiver 324 and host I/O 344. In this embodiment, the microprocessor 320, the 915 MHz RF transmitter 322, the 433 MHz RF receiver 324 and the host I/O 344 are powered from an external power supply 330 via an electronic control module power supply bus 332. The 915

MHz RF transmitter 322 receives a signal from microprocessor 320, and outputs an RF signal at a frequency of 915 MHz. This RF signal is output to RF antenna 328 for transmission through the unidirectional RF data communications link 336. The 433 MHz RF receiver 324 is receives an RF signal via the RF antenna 326 over the unidirectional RF data communications link 334 and outputs this signal to the microprocessor 320.

The two unidirectional wireless RF data communications links 334 and 336 collectively constitute the bidirectional data link 112. In this embodiment, the bidirectional data link is a wireless RF data link. Furthermore, the wireless charging link 114 is implemented by the unidirectional RF data communications link 336. Thus, the unidirectional RF data communications link 336 wirelessly transmits both data and the charging signal from the electronic control module 102 to the electronic lock module 106.

In one embodiment, the microprocessor 314 in the electronic lock module 106 periodically monitors the status of the charge on the rechargeable battery 108. The microprocessor 314 transmits this status of the charge on the rechargeable battery 108 as a data signal to the 433 MHz RF transmitter 304, which outputs this data signal to the RF antenna 308 that is electrically coupled to the 433 MHz RF transmitter 304. The RF antenna 308 transmits the data signal comprising the status of the rechargeable battery 108 over the unidirectional RF data communications link 334. This data signal is received by the RF antenna 326 electrically coupled to the 433 MHz RF receiver 324 that is a part of the electronic control module 102. The data signal received by the 433 MHz RF receiver 324 is transmitted to the microprocessor 320. The microprocessor 320 compares the received data signal, which is the status of the charge on the rechargeable battery, with a threshold value. If the status of the charge on the rechargeable battery is less than the threshold value, the microprocessor 320 transmits a charging signal to the 915 MHz RF transmitter 322. The 915 MHz RF transmitter 322 transmits this charging signal to RF antenna 328 which is electrically coupled to the 915 MHz RF transmitter 322. The RF antenna 328 wirelessly transmits the charging signal over the unidirectional RF data communications link 336. The charging signal is wirelessly received by the RF antenna 306 which is electrically coupled to the 915 MHz RF receiver 302. The RF antenna 306 wirelessly transmits the received charging signal to the 915 MHz RF receiver 302. The charging signal is used to power the 915 MHz RF receiver 302 and the battery charge module 310, and the charging signal is also transmitted to the battery charge module 310, which transmits the charging signal to charge the rechargeable battery 108. This embodiment implements the non-continuous charging method. In this embodiment, data from the electronic control module 102 is wirelessly transmitted to the electronic lock module 106 via the unidirectional RF data communications link 336 in a non-continuous manner, along with the wirelessly transmitted charging signal.

In another embodiment, the microprocessor 320 continuously transmits a charging signal to the 915 MHz RF transmitter 322 regardless of the status of the status of the charge on the rechargeable battery 108. The 915 MHz RF transmitter 322 transmits this charging signal to RF antenna 328 which is electrically coupled to the 915 MHz RF transmitter 322. The RF antenna 328 wirelessly transmits the charging signal over the unidirectional RF data communications link 336. The charging signal is wirelessly received by the RF antenna 306 which is electrically coupled to the 915 MHz RF receiver 302. The RF antenna 306 wirelessly transmits the received charging signal to the 915 MHz RF receiver 302. The charging signal is used to power the 915 MHz RF receiver 302 and the battery charge module 310, and the charging signal is also transmitted to the battery charge module 310, which transmits the charging signal to charge the rechargeable battery 108. This embodiment implements the continuous charging method. In this embodiment, data from the electronic control module 102 can be wirelessly transmitted to the electronic lock module 106 via the unidirectional RF data communications link 336 in a continuous manner, along with the wirelessly transmitted charging signal.

In some embodiments, a door sense module 316 monitors a status of the door 104, such as door open, door ajar, door shut and latch/bolt position sense. The door sense module 316 periodically transmits a door status data signal to the microprocessor 314. This door status data signal is transmitted by the microprocessor 314 to the 433 MHz RF transmitter 304, which then transmits this door status data signal to RF antenna 308 that is electrically coupled to the 433 MHz RF transmitter 304. The door status data signal is transmitted by the RF antenna 308 over the unidirectional RF data communications link 334. The door status data signal is received by RF antenna 326 that is electrically coupled to the 433 MHz RF receiver 324. RF antenna 326 transmits the received door status data signal to the 433 MHz RF receiver 324, which then transmits the door status data signal to microprocessor 320 for subsequent processing.

In other embodiments, the electronic lock module 106 periodically transmits a data signal to the electronic control module 102 via the unidirectional RF data communications link 334. The contents of this data signal include the charge status on the rechargeable battery 108 and the status of the door. This periodically transmitted data signal may be referred to as a heartbeat signal. In other embodiments, the monitoring of the door status is performed by the electronic control module 102.

Electronic control module 102 is also electrically coupled via an electrical coupling 342 to credential I/O module 340. The credential I/O module 340 reads an input from a user for authentication purposes. User input methods include, for example, magnetic cards, biometric devices, RFID cards, keypads, and smart devices such as smartphones and PDAs that use communication protocols such as Near Field Communication (NFC). The credential I/O module 340 transmits user input to the electronic control module 102 for authentication. The credential I/O module 340 also receives input from the electronic control module 102 via the electrical coupling 342, including user feedback that includes, but is not limited to, audio-visual signals either confirming or denying permission to enter.

In some embodiments, the credential I/O module 340 is physically attached to the door 104 and electrically coupled to the electronic lock module 106. In this embodiment, the credential I/O module 340, powered by rechargeable battery 108, reads an input from a user for authentication purposes. The credential I/O module 340 transmits user input to the electronic control module 102 for authentication via the unidirectional RF data communications link 334. The credential I/O module 340 also receives input from the electronic control module 102 via the unidirectional RF data communications link 336, including user feedback that includes, but is not limited to, audio-visual signals either confirming or denying permission to enter.

Electronic control module 102 is also electrically coupled via an electrical coupling 338 to the access control module 328 via the host I/O 344. The interface between the host I/O 344 and the access control module 328 is used for purposes such as user authentication, discussed in greater detail in the description of FIG. 4. In some embodiments, the electrical coupling 338 between the host I/O 344 and the access control module 328 is realized by standard connectivity methods that include, but are not limited to, Ethernet, Wi-Fi, RS485, RS422, RS232, or other wired or wireless communication methods.

In some embodiments, RF antennas 306, 308, 326 and 328 are functions of the physical separation between the electronic control module 102 and the electronic lock module 106. In one embodiment, antennas 308 and 326 are traces on a printed circuit board not to exceed 1.5 inches in length. In another embodiment, antennas 306 and 328 are 3.2 inches, or less, in length, and 0.6 inches in width.

Figure 4:
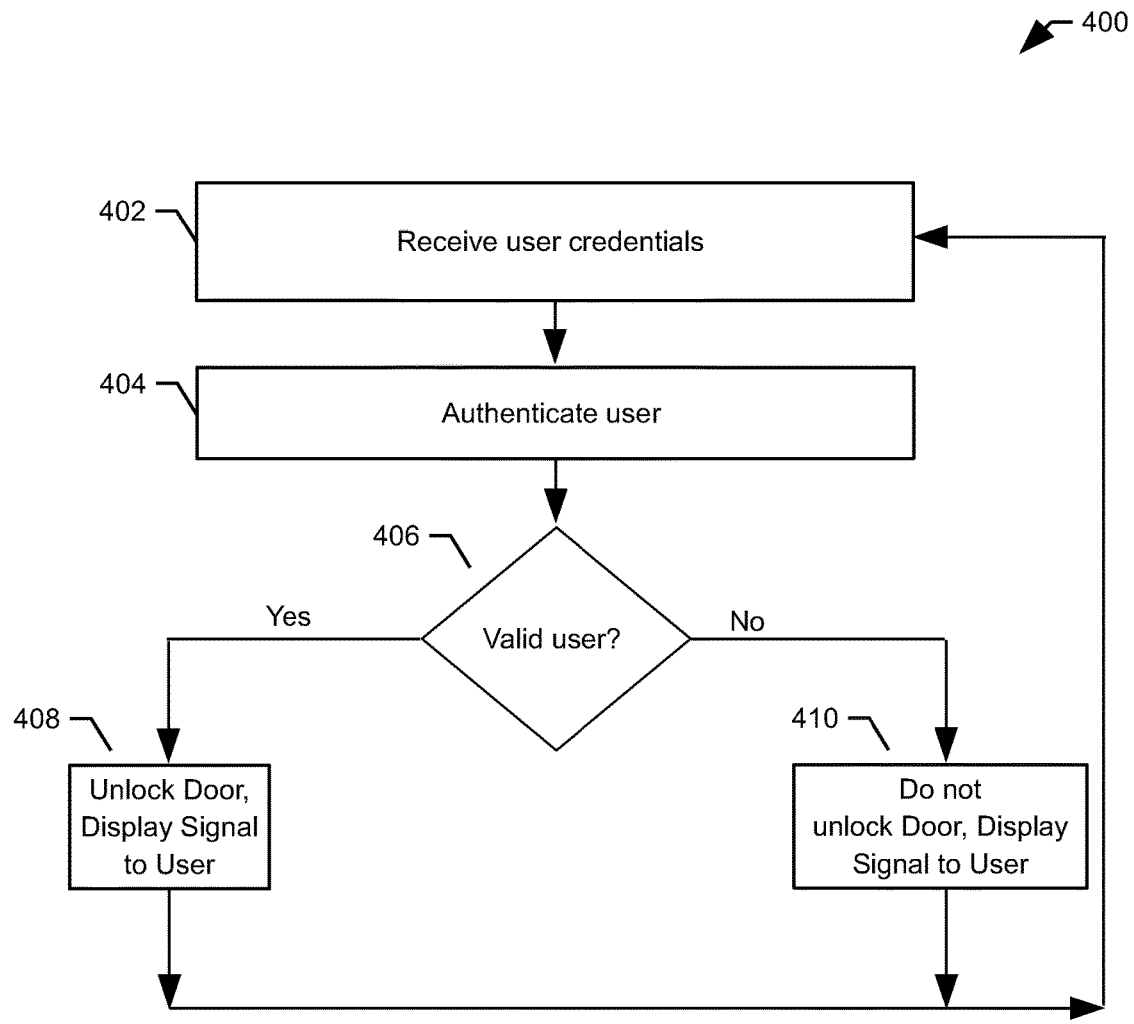
FIG. 4 represents a flow diagram depicting an embodiment of a method for authenticating a user to determine whether to unlock the door.

FIG. 4 represents a flow diagram depicting an embodiment of a method 400 for authenticating a user to determine whether to unlock the door. In some embodiments, the electronic door lock 110 is locked by default. The method 400 receives user credentials at 402. In some embodiments, user credentials are received by the electronic control module 102 from the credential I/O module 340, via the electrical coupling 342. The host I/O 344 transmits the user credentials to the access control module 328 via electrical coupling 338 in order to authenticate the user at 404. The access control module 328 processes the user credentials and determines the authenticity of the user at 406. The access control module 328 transmits the decision on user authenticity back to the host I/O 344. In some embodiments, the access control module comprises a numeric keypad that is used by a user to enter credential information. If the user is not a valid user, then the method 400 transmits a user appropriate feedback signal to the user and the door 104 is not unlocked, at 410. The user feedback signal is transmitted from the electronic control module 102 to the credential I/O module 340 via the electrical coupling 342. The credential I/O module 340 displays the appropriate feedback to the user via methods that include audio and visual feedback. If the authentication 406 determines that the user is a valid user, then the method 400 transmits an appropriate feedback signal to the user and the door 104 is unlocked, at 408. In some embodiments, the decision to unlock the door 104 by the access control module 328 is made based on other criteria in addition to the user credentials, wherein the criteria may include but are not limited to the time-of-day, whether the day that access is requested is a weekend or a holiday, whether the building is in lockdown mode, the maximum number of people allowed in a room or within the building, and so on.

The user feedback signal is transmitted from the electronic control module 102 to the credential I/O module 340 via the electrical coupling 342. The credential I/O module 340 displays the appropriate feedback to the user via methods that include audio and visual feedback. The door unlock process involves the control module 102 sending a door unlock command data signal to the electronic lock module 106 via the unidirectional RF data communications link 336. In order to achieve this, the microprocessor 320 sends the door unlock command data signal to the 915 MHz RF transmitter 322, which then transmits the door unlock command data signal over the unidirectional RF data communications link 336 via RF antenna 328. The electronic lock module 106 receives the door unlock command data signal. This is achieved by the RF antenna 306 receiving the door unlock command data signal over the unidirectional RF data communications link 336. The RF antenna 306 then transmits the received door unlock command data signal to the 915 MHz RF receiver 302, which transmits this door unlock command data signal to the microprocessor 314 which issues a command to the electronic lock to unlock the door 104. The method 400 then returns to 402 and the process repeats.

Figure 5:
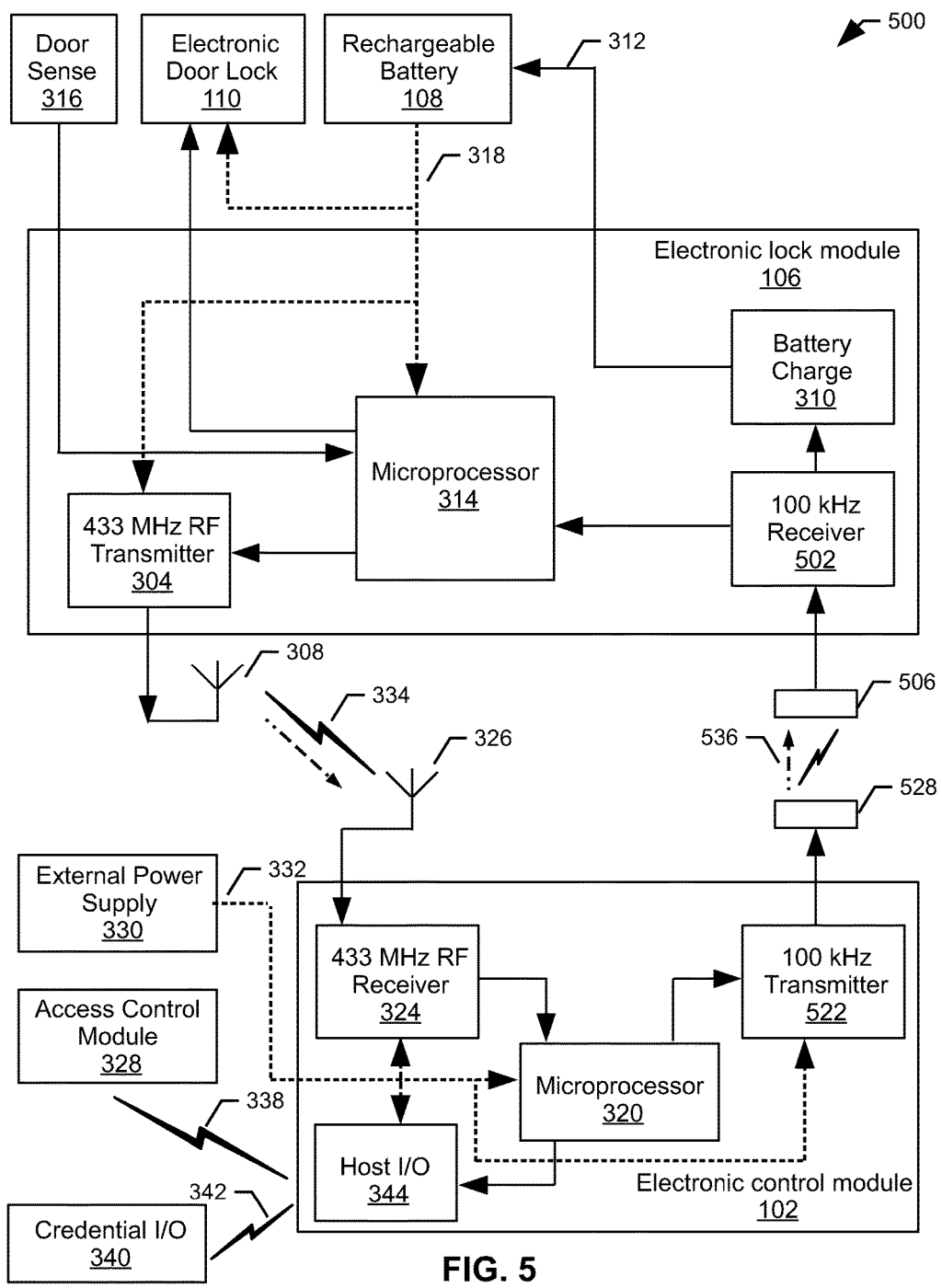
FIG. 5 represents a block diagram that shows another embodiment of the wireless battery charging system.

FIG. 5 represents a block diagram that shows another embodiment of the wireless battery charging system 500. Many of the components shown in FIG. 5 are similar to the components shown in FIG. 3 and, therefore, are identified with the same reference numbers. This embodiment shows the electronic control module 102 and the electronic lock module 106. Also shown are the rechargeable battery 108 and the electronic door lock 110. In one embodiment, the electronic lock module 106 includes the microprocessor 314, the 433 MHz RF transmitter 304, a 100 kHz receiver 502, and the battery charge module 310. In one embodiment, the rechargeable battery 108 supplies power to the electronic door lock 110, the microprocessor 314, and the 433 MHz transmitter 304, via the electronic lock module power supply bus 318. The 433 MHz RF transmitter 304 receives a signal from microprocessor 314, and outputs an RF signal at a frequency of 433 MHz. This RF signal is output to RF antenna 308 for transmission through the unidirectional RF data communications link 334. The 100 kHz receiver 502 is powered by a wireless signal received by a solenoid 506 over a unidirectional inductively coupled wireless communications link 536. In other embodiments, the unidirectional link 536 may be comprised of a magnetically coupled link. The unidirectional inductively coupled wireless communications link 536 is configured to wirelessly transmit both data and a charging signal that is used to recharge the rechargeable battery 108.

In one embodiment, the electronic control module 102 includes microprocessor 320, a 100 kHz transmitter 522, the 433 MHz RF receiver 324 and host I/O 344. In this embodiment, the microprocessor 320, the 100 kHz transmitter 522, the 433 MHz RF receiver 324 and the host I/O 344 are powered from external power supply 330 via the electronic control module power supply bus 332. The 100 kHz transmitter 522 receives a signal from microprocessor 320, and outputs a signal at a frequency of 100 kHz. This 100 kHz signal is output to solenoid 528 for transmission over the unidirectional inductively coupled wireless communications link 536. The 433 MHz RF receiver 324 receives an RF signal via the RF antenna 326 over the unidirectional RF data communications link 334 and outputs this signal to the microprocessor 320.

In this embodiment, the unidirectional wireless RF data communications link 334 and the unidirectional inductively coupled wireless communications link 536 collectively constitute the bidirectional data link 112. Furthermore, the wireless charging link 114 is implemented by the unidirectional inductively coupled wireless communications link 536. Thus, the unidirectional inductively coupled wireless communications link 536 wirelessly transmits both data and the charging signal from the electronic control module 102 to the electronic lock module 106.

In one embodiment, the microprocessor 314 in the electronic lock module 106 periodically monitors the status of the charge on the rechargeable battery 108. The microprocessor 314 transmits this status of the charge on the rechargeable battery 108 as a data signal to the 433 MHz RF transmitter 304, which outputs this data signal to the RF antenna 308 that is electrically coupled to the 433 MHz RF transmitter 304. The RF antenna 308 transmits the data signal comprising the status of the rechargeable battery 108 over the unidirectional RF data communications link 334.

This data signal is received by the RF antenna 326 electrically coupled to the 433 MHz RF receiver 324 that is a part of the electronic control module 102. The data signal received by the 433 MHz RF receiver 324 is transmitted to the microprocessor 320. The microprocessor 320 compares the received data signal, which is the status of the charge on the rechargeable battery, with a threshold value. If the status of the charge on the rechargeable battery is less than the threshold value, the microprocessor 320 transmits a charging signal to the 100 kHz transmitter 522. The 100 kHz transmitter 522 transmits this charging signal to solenoid 528 which is electrically coupled to the 100 kHz transmitter 522. The solenoid 528 wirelessly transmits the charging signal over the unidirectional inductively coupled wireless communications link 536. The charging signal is wirelessly received by the solenoid 506 which is electrically coupled to the 100 kHz receiver 502. The solenoid 506 transmits the received charging signal to the 100 kHz receiver 302. The charging signal is used to power the 100 kHz receiver 502 and the battery charge module 310, and the charging signal is also transmitted to the battery charge module 310, which transmits the charging signal to charge the rechargeable battery 108. This embodiment implements the non-continuous charging method. In this embodiment, data from the electronic control module 102 is wirelessly transmitted to the electronic lock module 106 via the unidirectional inductively coupled wireless communications link 536 in a non-continuous manner, along with the wirelessly transmitted charging signal.

In another embodiment, the microprocessor 320 transmits a charging signal to the 100 kHz transmitter 522 regardless of the status of the charge on the rechargeable battery 108. The 100 kHz transmitter 522 transmits this charging signal to solenoid 528 which is electrically coupled to the 100 kHz transmitter 522. The solenoid 528 wirelessly transmits the charging signal over the unidirectional inductively coupled wireless communications link 536. The charging signal is wirelessly received by the solenoid 506 which is electrically coupled to the 100 kHz receiver 502. The solenoid 506 transmits the received charging signal to the 100 kHz receiver 302. The charging signal is used to power the 100 kHz receiver 502 and the battery charge module 310, and the charging signal is also transmitted to the battery charge module 310, which transmits the charging signal to charge the rechargeable battery 108. This embodiment implements the continuous charging method. In this embodiment, data from the electronic control module 102 can be wirelessly transmitted to the electronic lock module 106 via the unidirectional inductively coupled wireless communications link 536 in a continuous manner, along with the wirelessly transmitted charging signal.

In some embodiments, both solenoids 528 and 506 and the associated transmitter 522 and receiver 502 are resonant at (i.e., are tuned to) a frequency of 100 kHz. In other embodiments, the resonant frequency may be a frequency different from 100 kHz.

In other embodiments, the door sense module 316 monitors a status of the door 104, such as door open, door ajar, door shut and latch/bolt position sense. The door sense module 316 periodically transmits a door status data signal to the microprocessor 314. This door status data signal is transmitted by the microprocessor 314 to the 433 MHz RF transmitter 304, which then transmits this data signal to RF antenna 308 that is electrically coupled to the 433 MHz RF transmitter 304. The door status data signal is transmitted by the RF antenna 308 over the unidirectional RF data communications link 334. The door status data signal is received by RF antenna 326 that is electrically coupled to the 433 MHz RF receiver 324. RF antenna 326 transmits the received door status data signal to the 433 MHz RF receiver 324, which then transmits the door status data signal to microprocessor 320 for subsequent processing.

In other embodiments, the electronic lock module 106 periodically transmits a data signal to the electronic control module 102 via the unidirectional RF data communications link 334. The contents of this data signal include the charge status on the rechargeable battery 108 and the status of the door. This periodically transmitted data signal may be referred to as a heartbeat signal. In other embodiments, the monitoring of the door status is performed by the electronic control module 102.

Electronic control module 102 is also electrically coupled via an electrical coupling 342 to credential I/O module 340. The credential I/O module 340 reads an input from a user for authentication purposes. User input methods include, for example, magnetic cards, biometrics, keypads, and smart devices such as smartphones and PDAs that use communication protocols such as Near Field Communication (NFC). The credential I/O module 340 transmits user input to the electronic control module 102 for authentication. The credential I/O module 340 also receives input from the electronic control module 102 via the electrical coupling 342, including user feedback that includes, but is not limited to, audio-visual signals either confirming or denying permission to enter.

In some embodiments, the credential I/O module 340 is physically attached to the door 104 and electrically coupled to the electronic lock module 106. In this embodiment, the credential I/O module 340, powered by rechargeable battery 108, reads an input from a user for authentication purposes. The credential I/O module 340 transmits user input to the electronic control module 102 for authentication via the unidirectional RF data communications link 334. The credential I/O module 340 also receives input from the electronic control module 102 via the unidirectional inductively coupled wireless communications link 536, including user feedback that includes, but is not limited to, audio-visual signals either confirming or denying permission to enter.

Electronic control module 102 is also electrically coupled via an electrical coupling 338 to the access control module 328 via the host I/O 344. The interface between the host I/O 344 and the access control module 328 is used for purposes such as user authentication, discussed in greater detail in the description of FIG. 4. In some embodiments, the electrical coupling 338 between the host I/O 344 and the access control module 328 is realized by standard connectivity methods that include, for example, Ethernet or Wi-Fi.

In some embodiments, RF antennas 308 and 326 are functions of the physical separation between the electronic control module 102 and the electronic lock module 106. In one embodiment, antennas 308 and 326 are traces on a printed circuit board not to exceed 1.5 inches in length.

In some embodiments, solenoids 506 and 528 are comprised of ferrite cores. In other embodiments, solenoids 506 and 528 may be replaced by air wound coils. In other embodiments, solenoids 506 and 528 include cores that are comprised of materials with high magnetic permeability. Example dimensions of solenoids include but are not limited to 0.275 inches in diameter and 1.5 inches in length.

In some embodiments, the transmission frequency associated with the unidirectional inductively coupled wireless communications link 536 may be different from 100 kHz, for example the transmission frequency could be 135 kHz, or as high as 400 kHz. In other embodiments, the unidirectional RF data communications link 334 may be replaced by a unidirectional inductively coupled wireless communications link that is similar to the unidirectional inductively coupled wireless communications link 536. This unidirectional inductively coupled wireless communications link may be comprised of solenoids similar to solenoids 506 and 528, and include the corresponding transmitter and receiver similar to 522 and 502 respectively, at the appropriate transmission frequency.

Figure 6:
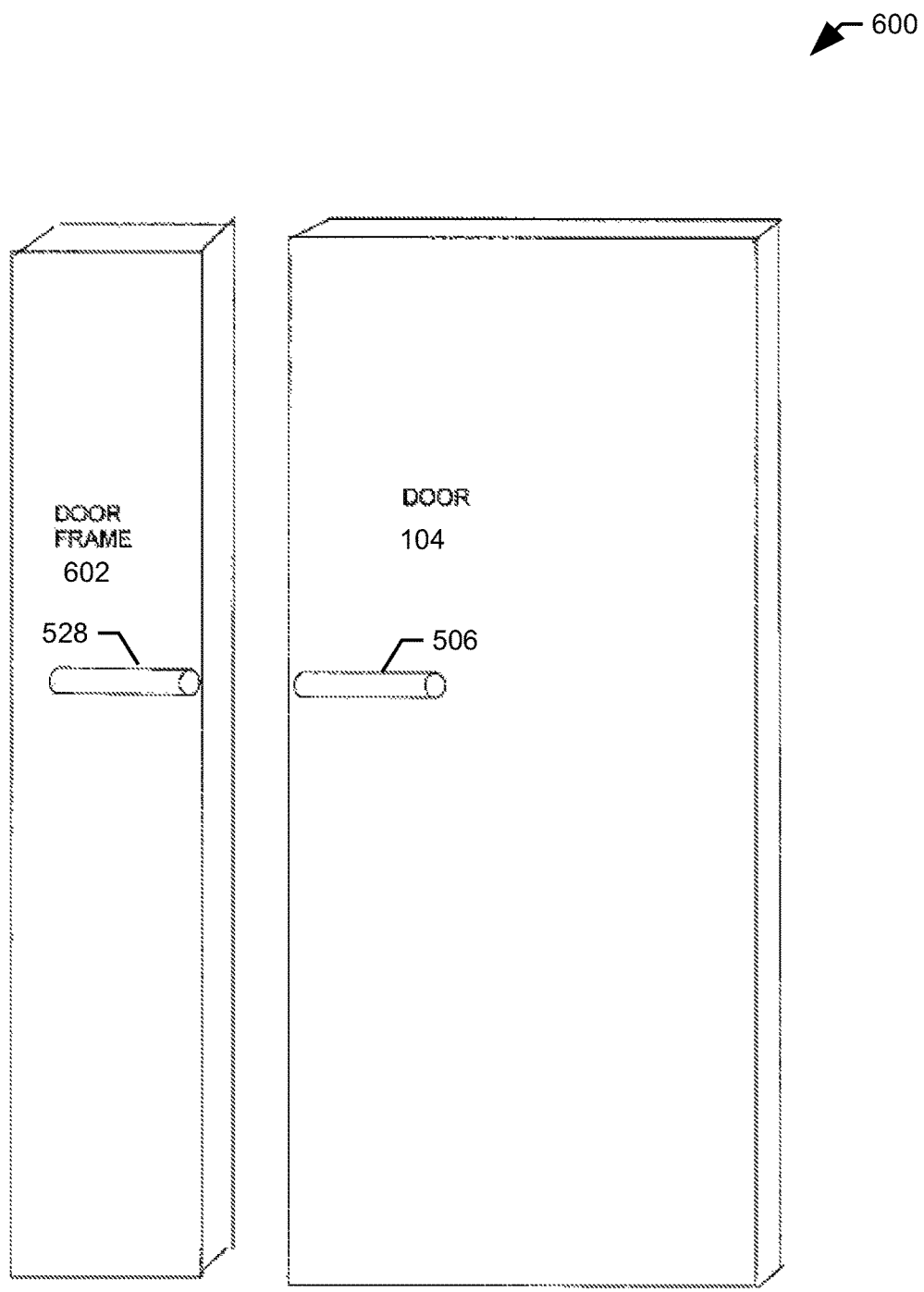
FIG. 6 is a representation of a physical implementation of a component of an embodiment of the wireless battery charging system.

FIG. 6 is a representation of a physical implementation of a component of an embodiment of the wireless battery charging system 600. This embodiment shows the solenoid 528 associated with the electronic control module 102, wherein the solenoid 528 is mounted on (or mounted within) the door frame 602. The solenoid 506 associated with the electronic lock module 106 is mounted on (or mounted within) the door 104. In this embodiment, the solenoids 506 and 528 are positioned such that they are coaxial. In another embodiment, the solenoids 506 and 528 may not be coaxial. The solenoids 506 and 528 generate the unidirectional inductively coupled wireless communications link 536.

Figure 7:
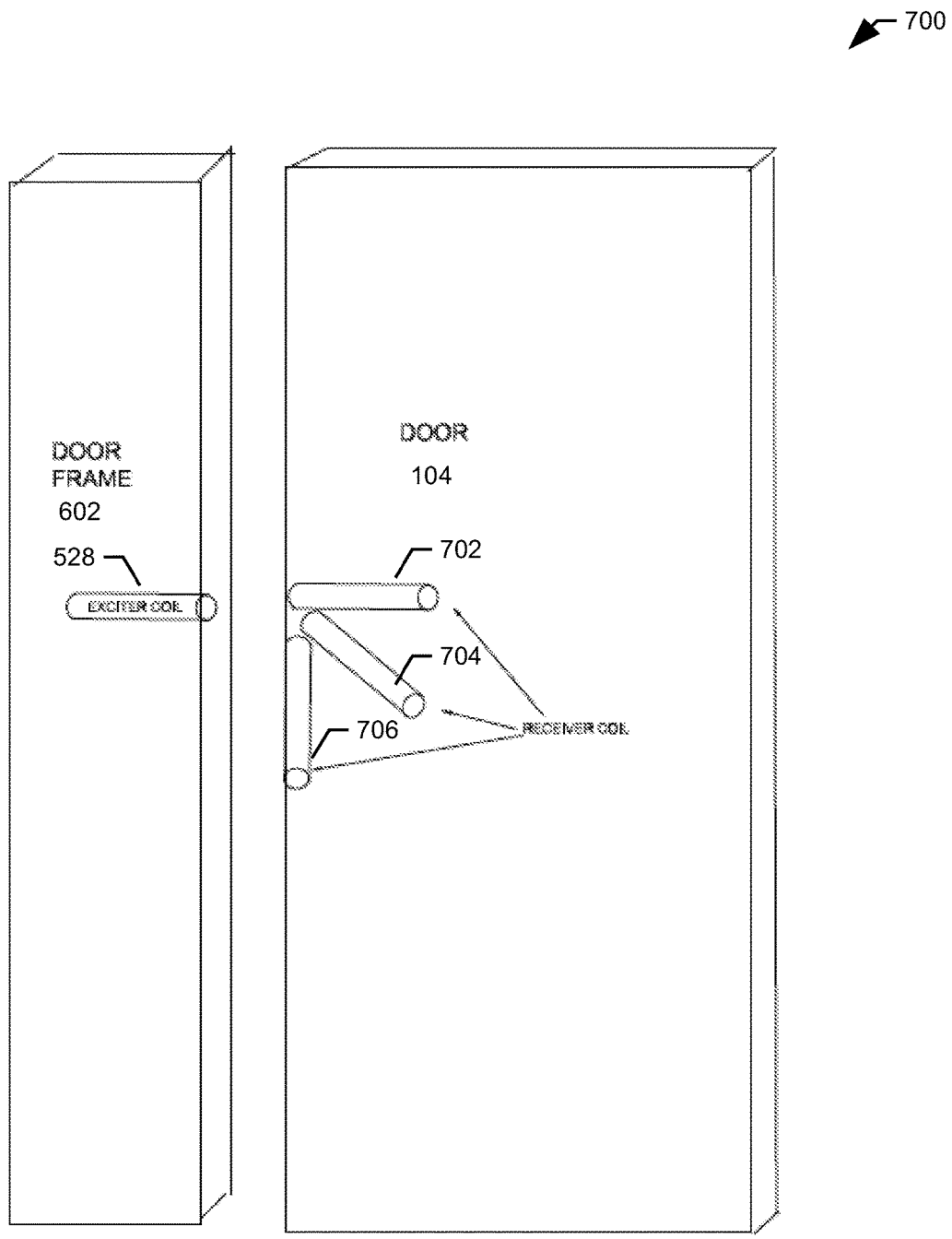
FIG. 7 is an alternate representation of a physical implementation of a component of an embodiment of the wireless battery charging system.

FIG. 7 is an alternate representation of a physical implementation of a component of an embodiment of the wireless battery charging system 700. In this embodiment, the solenoid 528 associated with the electronic control module 102, also referred to as the exciter coil, is mounted on (or within) the door frame 602. Mounting positions 702, 704 and 706 show some different possible mounting locations in which the solenoid 506 associated with the electronic lock module 106, also referred to as the receiver coil, is mounted on (or within) the door 104. These mounting positions 702, 704 and 706 are possible because the solenoids 528 and 506 do not have to be coaxial in order to establish the unidirectional inductively coupled wireless communications link 536. In an embodiment, the receiver coil 506 can be up to 1 inch from the exciter coil 528, and offset center-to-center by up to 0.5 inches.

Figure 8:
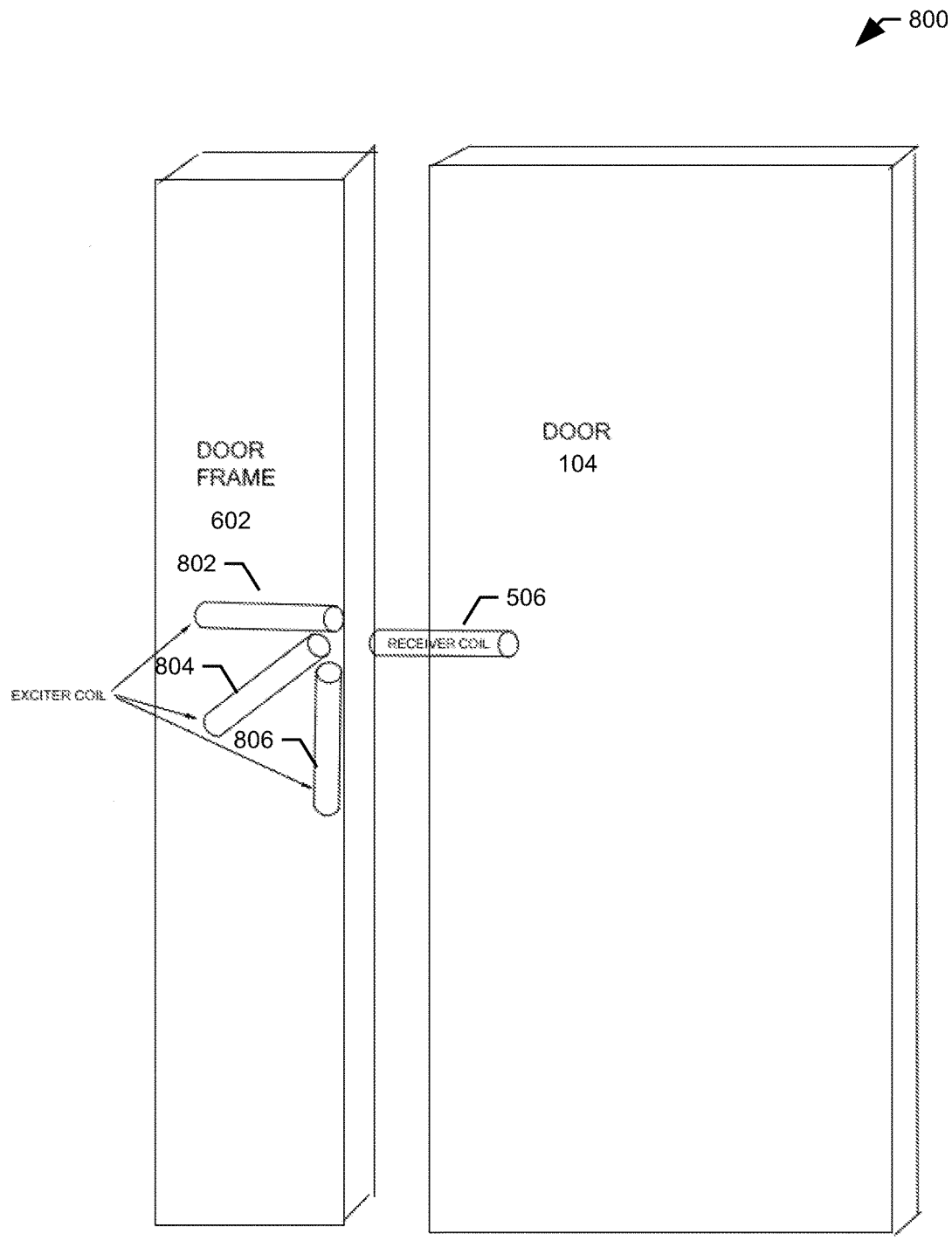
FIG. 8 is another alternate representation of a physical implementation of a component of an embodiment of the wireless battery charging system.

FIG. 8 is another alternate representation of a physical implementation of a component of an embodiment of the wireless battery charging system 800. In this embodiment, the solenoid 506 associated with the electronic lock module 106, also referred to as the receiver coil, is mounted on (or within) the door 104. Mounting positions 802, 804 and 806 show different possible mounting locations in which the solenoid 528 associated with the electronic control module 102, also referred to as the exciter coil, is mounted on (or within) the door frame 602. These mounting positions 802, 804 and 806 are possible because the solenoids 528 and 506 do not have to be coaxial in order to establish the unidirectional inductively coupled wireless communications link 536. In an embodiment, the exciter coil 528 can be up to 1 inch from the receiver coil 506, and offset center-to-center by up to 0.5 inches.

Although the present disclosure is described in terms of certain example embodiments, other embodiments will be apparent to those of ordinary skill in the art, given the benefit of this disclosure, including embodiments that do not provide all of the benefits and features set forth herein, which are also within the scope of this disclosure. It is to be understood that other embodiments may be utilized, without departing from the scope of the present disclosure.

The invention claimed is:

1. An apparatus for locking and unlocking a door mounted in a door frame, the apparatus comprising:
an electronic lock module powered by a rechargeable battery;
an electronic control module, when powered, operative to provide a wireless charging link between the electronic control module and the electronic lock module and to transmit a wireless charging signal from the electronic control module to the electronic lock module over the wireless charging link;
wherein the electronic lock module, when receiving the wireless charging signal uses the wireless charging signal to charge the rechargeable battery;
a bi-directional data communications link established between the electronic control module and the electronic lock module when both are powered to transmit data signals in a first direction from the electronic control module to the electronic lock module using a first electromagnetic signal having a first radio frequency, and in a second direction from the electronic lock module to the electronic control module using a second electromagnetic signal having a second radio frequency,
wherein the second radio frequency is different from the first radio frequency; and
a lock for locking the door, the lock coupled to the electronic lock module and having a locked state and an unlocked state selectable by the electronic lock module.

2. The apparatus of claim 1, further comprising:
a first antenna tuned to operate at the first frequency and electrically coupled to the electronic control module;
a second antenna tuned to operate at the first frequency and electrically coupled to the electronic lock module;
a third antenna tuned to operate at the second frequency and electrically coupled to the electronic control module; and
a fourth antenna tuned to operate at the second frequency and coupled to the electronic lock module.

3. The apparatus of claim 1, further comprising:
circuitry coupled to the rechargeable battery, the circuitry, when powered, monitoring a state of charge of the rechargeable battery and in response to the state of charge causing the electronic lock module to request the electronic control module to provide a wireless charging signal over the wireless charging link.

4. A method for controlling the lock state of a door mounted in a door frame, the door having a lock settable to one of a locked state or an unlocked state, an electronic lock module for setting the state of the lock to locked or unlocked, the electronic lock module electronically coupled to and powered by a rechargeable battery, the method comprising:
receiving a charging signal wirelessly over a wireless charging link from an electronic control module mounted off of the door and physically separate from the electronic lock module;
using the received charging signal to charge the rechargeable battery; and
using a bi-directional data communications link configured to transmit
first data signals in a first direction from the electronic control module to the electronic lock module using a first electromagnetic signal having a first radio frequency, and
second data signals in a second direction from the electronic lock module to the electronic control module using a second electromagnetic signal having a second radio frequency, the second radio frequency being different from the first radio frequency.

5. The method of claim 4, wherein the first data signals include instructions to set the lock to an unlocked state.

6. The method of claim 4, wherein the second data signals include credential data received by the electronic lock module.

7. The method of claim 4, wherein the second data signals include a request to provide the charging signal.

8. The method of claim 4, wherein the second data signals include a request to cease providing the charging signal.

9. The method of claim 4, wherein the first data signals include instructions to set the lock to a locked state.

* * * * *